United States Patent
Choi et al.

(10) Patent No.: US 11,268,210 B2
(45) Date of Patent: Mar. 8, 2022

(54) METHOD FOR MANUFACTURING TRANSITION METAL CHALCOGENIDE AND TRANSITION METAL CHALCOGENIDE PREPARED THEREBY

(71) Applicant: KOREA ADVANCED INSTITUTE OF SCIENCE AND TECHNOLOGY, Daejeon (KR)

(72) Inventors: Sung-Yool Choi, Daejeon (KR); Woonggi Hong, Daejeon (KR); Gi Woong Shim, Daejoen (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/925,674

(22) Filed: Jul. 10, 2020

(65) Prior Publication Data
US 2022/0010456 A1 Jan. 13, 2022

(51) Int. Cl.
C30B 25/02 (2006.01)
C30B 31/18 (2006.01)
C23C 16/30 (2006.01)
C30B 29/46 (2006.01)

(52) U.S. Cl.
CPC ............ *C30B 31/18* (2013.01); *C23C 16/305* (2013.01); *C30B 25/02* (2013.01); *C30B 29/46* (2013.01)

(58) Field of Classification Search
CPC ......... C30B 25/02; C30B 29/46; C30B 31/18; C23C 16/305
See application file for complete search history.

(56) References Cited

U.S. PATENT DOCUMENTS

| | | | | |
|---|---|---|---|---|
| 4,126,732 A * | 11/1978 | Schoolar | ............... | H01L 21/471 252/62.3 GA |
| 4,282,045 A * | 8/1981 | Jensen | .................. | C30B 23/007 148/33.3 |
| 2012/0313200 A1* | 12/2012 | Jackrel | ............... | H01L 31/0749 257/431 |
| 2012/0329208 A1* | 12/2012 | Pore | .................. | H01L 21/02546 438/102 |
| 2013/0267082 A1* | 10/2013 | Gatineau | ................. | C23C 16/30 438/508 |
| 2019/0279900 A1* | 9/2019 | Mullick | .............. | C23C 14/0623 |
| 2019/0338416 A1* | 11/2019 | Kong | ................ | C23C 16/45512 |

FOREIGN PATENT DOCUMENTS

KR 10-2016-0099258 8/2016

* cited by examiner

*Primary Examiner* — Robert M Kunemund

(57) ABSTRACT

The present disclosure provides a method for preparing a transition metal chalcogenide including: a step of forming a transition metal chalcogenide thin film; and a step of controlling the defects of the transition metal chalcogenide thin film by injecting a processing gas including oxygen and nitrogen to the formed transition metal chalcogenide thin film.

16 Claims, 4 Drawing Sheets

---

Formation of crystal nuclei of transition metal chalcogenide on substrate

↓

Growth of transition metal chalcogenide from crystal nuclei of transition metal chalcogenide

↓

Control of defects of transition metal chalcogenide thin film by injecting mixture gas of oxygen and nitrogen to transition metal chalcogenide thin film

METHOD FOR MANUFACTURING TRANSITION METAL CHALCOGENIDE AND TRANSITION METAL CHALCOGENIDE PREPARED THEREBY

BACKGROUND OF THE INVENTION

Field of the Invention

The present disclosure relates to a method for preparing a transition metal chalcogenide and a transition metal chalcogenide prepared thereby. More specifically, it relates to a method for preparing a transition metal chalcogenide, which is capable of controlling the interatomic defects of the transition metal chalcogenide, modulating the electrical/optical characteristics of the transition metal chalcogenide without physical damage through an interatomic chemical reaction, and preventing degradation of optical characteristics, and a transition metal chalcogenide prepared thereby.

Description of the Related Art

Transition metal dichalcogenides (TMDs) with atomic level thicknesses are drawing attentions as a next-generation semiconductor material due to excellent mechanical, optical and electrical properties.

In the beginning, samples were prepared through mechanical or chemical exfoliation from naturally occurring minerals. But, presently, with the advancement of researches, large-area synthesis is achieved through bottom-up techniques such as chemical vapor deposition (CVD).

However, since the synthetically produced TMDs have polycrystalline structures, line defects such as grain boundaries occur, which degrade the electrical and optical characteristics of thin films.

In addition, due to very small thickness, it is not easy to modulate the electrical characteristics of the material.

For instance, Korean Patent Application Publication No. 10-2016-0099258, published on Aug. 22, 2016, discloses a method of preparing large-area tungsten dichalcogenide. However, the publication fails to resolve the intrinsic line defect problem of TMDs.

SUMMARY OF THE INVENTION

The present disclosure is directed to providing a method capable of solving the problems of TMDs, such as defects, etc.

According to the present disclosure, the interatomic defects of a transition metal chalcogenide can be controlled through controlled oxygen supply, the electrical/optical characteristics of the transition metal chalcogenide can be modulated as desired without physical damage through formation of chalcogenide vacancies based on an interatomic chemical reaction, and the degradation of optical characteristics can be prevented.

In one general aspect, there is provided a method for preparing a transition metal chalcogenide comprising: a step of forming a transition metal chalcogenide thin film; and a step of controlling the defects of the transition metal chalcogenide thin film by injecting a processing gas comprising oxygen to the formed transition metal chalcogenide thin film.

According to an embodiment of the present disclosure, the step of forming the transition metal chalcogenide thin film comprises: a step of forming crystal nuclei of a transition metal chalcogenide on a substrate; and a step of growing a transition metal chalcogenide from the crystal nuclei of a transition metal chalcogenide.

According to another embodiment of the present disclosure, the volume ratio of $O_2$ in the processing gas is 1-10 wt %.

According to still another embodiment of the present disclosure, the processing gas comprises $O_2$ and $N_2$.

According to still another embodiment of the present disclosure, a temperature of the defect control step is higher than room temperature and lower than a temperature of the growth step.

According to still another embodiment of the present disclosure, n-doping occurs in the transition metal chalcogenide through the control of the defects.

According to still another embodiment of the present disclosure, chalcogenide vacancies are formed through the step of controlling the defects and oxygen is bound to the chalcogenide vacancies.

According to still another embodiment of the present disclosure, the transition metal chalcogenide comprises one or more selected from a group consisting of $MoS_2$, $MoSe_2$, $MoTe_2$, $WS_2$, $WSe_2$ and $WTe_2$.

According to still another embodiment of the present disclosure, the transition metal chalcogenide is $MoS_2$ and sulfur vacancies are formed through the step of controlling the defects.

In another aspect of the present disclosure, a transition metal chalcogenide prepared by a method for preparing a transition metal chalcogenide comprising: a step of forming a transition metal chalcogenide thin film; and a step of controlling the defects of the transition metal chalcogenide thin film by injecting a processing gas comprising oxygen to the formed transition metal chalcogenide thin film.

According to an embodiment of the present disclosure, oxygen is located on chalcogenide vacancies of the transition metal chalcogenide.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
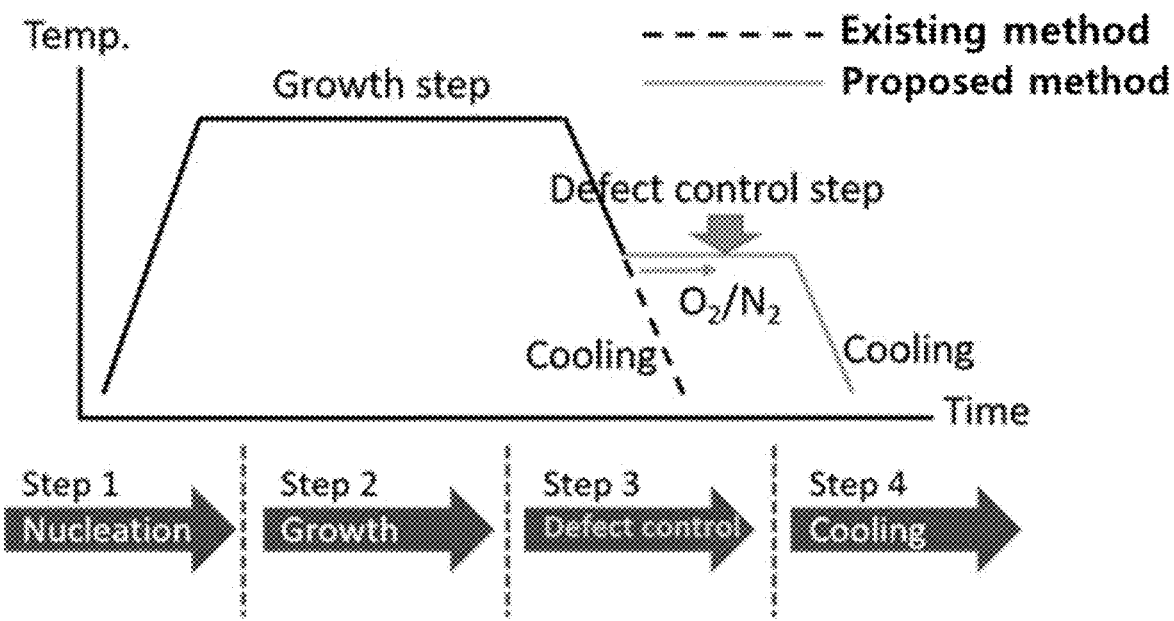
FIG. 1 shows the change in temperature with time in a process of a method for preparing a transition metal chalcogenide according to an exemplary embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

In order to solve the above-described problem, the present disclosure provides a method for controlling the defects of a thin film after a transition metal chalcogenide such as $MoS_2$ has grown from crystal nuclei by heat-treating the thin film under nitrogen-oxygen condition.

That is to say, in an exemplary embodiment of the present disclosure, a step of controlling defects using oxygen (5%)/nitrogen (95%) processing gas is added during synthesis in order to induce n-doping effect by separating a chalcogenide component from the transition metal chalcogenide and reducing work function. In addition, by substituting the vacancies of the chalcogenide component (e.g., sulfur in $MoS_2$) present in the grain boundary with oxygen atoms, the defect state in the band gap may be removed and, thus, optical characteristics can be improved further.

FIG. 1 shows the change in temperature with time in a process of a method for preparing a transition metal chalcogenide according to an exemplary embodiment of the present disclosure.

Figure 2:
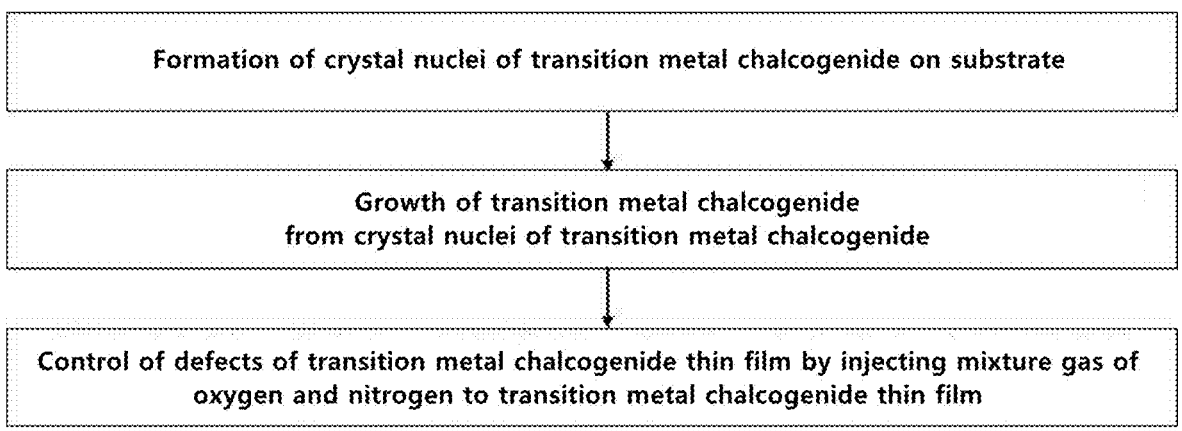
FIG. 2 shows a block diagram of a method for preparing a transition metal chalcogenide according to an exemplary embodiment of the present invention.

Referring to FIGS. 1 and 2, an exemplary embodiment of the present disclosure provides a method for preparing a transition metal chalcogenide, which includes: a step of forming crystal nuclei of a transition metal chalcogenide on a substrate (step 1: nucleation); a step of growing a transition metal chalcogenide from the crystal nuclei of a transition metal chalcogenide (step 2: growth); and a step of controlling the defects of the transition metal chalcogenide thin film by injecting a processing gas including oxygen to the formed transition metal chalcogenide thin film (step 3: defect control).

In an exemplary embodiment of the present disclosure, the processing gas may include 1-10 vol % of oxygen, with the remainder being an inert gas such as nitrogen. If the oxygen content is smaller, the effect of defect control and chalcogenide vacancy substitution by oxygen may be insignificant. And, if it exceeds the above range, excessive etching and oxidation of the thin film may occur. Accordingly, the content of 02 is 1-10 vol %, more specifically 3-8 vol %, most specifically 5 vol %.

Particularly referring to FIG. 2, instead of a post-growth cooling step of the existing method, a defect control step of heat-treating the thin film with an oxygen-including gas for a predetermined time at a predetermined temperature (higher than room temperature and lower than growth temperature) is added after the growth at high temperature in order to control the defects and work function of the thin film.

In an exemplary embodiment of the present disclosure, the growth is performed at 600° C. and the defect control step is performed at 350° C. However, heat-treatment with an oxygen-including gas at any temperature which is higher than room temperature and lower than the growth temperature is included within the scope of the present disclosure.

EXAMPLE

A transition metal chalcogenide thin film according to the present disclosure was prepared as follows.

1. Increasing the Temperature of a Reaction Furnace (20 minutes)

Temperature was increased to 600° C. while injecting 1000 sccm of $N_2$.

2. Nucleation (10 Minutes or Shorter)

200 sccm of $N_2$, 2 sccm of $H_2$, 0.0175 sccm of molybdenum hexacarbonyl (MHC, Mo precursor) and 0.8823 sccm diethyl sulfide (DES, S precursor) were injected.

3. Growth (50 Minutes)

200 sccm of $N_2$, 2 sccm of $H_2$, 0.0175 sccm of molybdenum hexacarbonyl (MHC, Mo precursor) and 0.8823 sccm diethyl sulfide (DES, S precursor) were injected.

4. Defect Control (3 Minutes)

After lowering the temperature of the reaction furnace to 350° C. while injecting 200 sccm of $N_2$, 200 sccm of $N_2$ and 10 sccm of $O_2$ ($O_2$ 5 vol %) were injected.

5. Cooling (30 Minutes or Longer)

The reaction furnace was cooled while injecting 200 sccm of $N_2$ only.

Test Example 1

Ultraviolet Photoelectron Spectroscopy (UPS) Measurement

In this test example, the Fermi level was measured by UPS.

Figure 3:
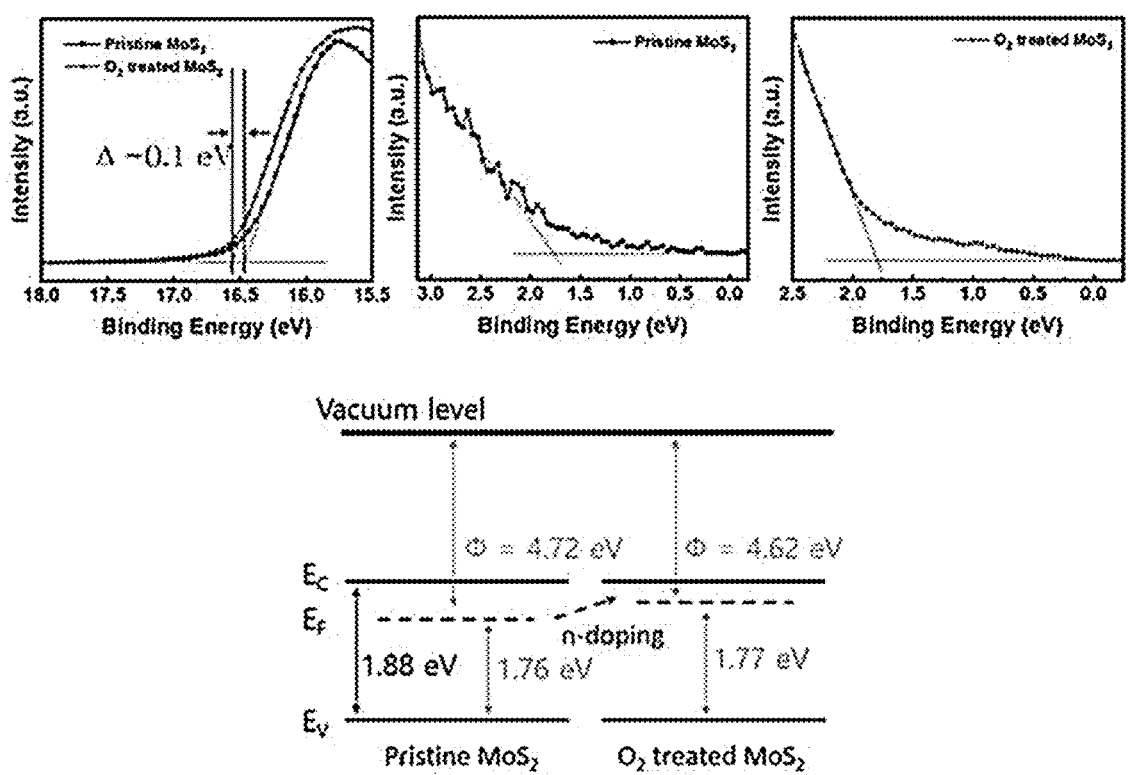
FIG. 3 shows an ultraviolet photoelectron spectroscopy (UPS) measurement result.

FIG. 3 shows an ultraviolet photoelectron spectroscopy (UPS) measurement result.

Referring to FIG. 3, it can be seen that for the thin film ($O_2$-treated $MoS_2$) that has passed undergone the defect control step according to the present disclosure, the Fermi level is increased by 0.1 eV. This means that n-doping occurred due to the heat-treatment with the oxygen/nitrogen processing gas according to the present disclosure.

Test Example 2

X-Ray Photoelectron Spectroscopy (XPS) Measurement

In this test example, compositional analysis was conducted by XPS.

Figure 4:
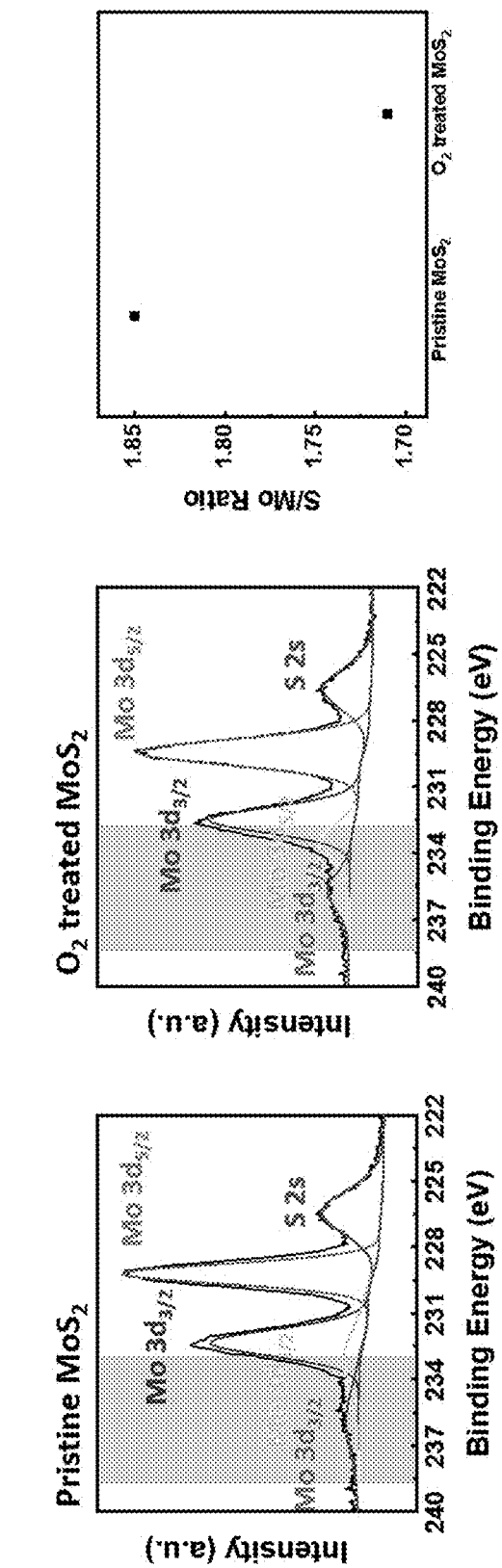
FIG. 4 shows an X-ray photoelectron spectroscopy (XPS) measurement result.

FIG. 4 shows an X-ray photoelectron spectroscopy (XPS) measurement result.

Referring to FIG. 4, pristine $MoS_2$ that has not undergone the defect control step according to the present disclosure shows Mo:S=1:1.85, and the $O_2$-treated $MoS_2$ sample that has undergone the defect control step according to the present disclosure shows Mo:S:O=1:1.71:0.34.

This means that sulfur (chalcogenide component) vacancy was formed in the sample treated according to the present disclosure, which resulted in n-doping. This result is consistent with the UPS measurement data of FIG. 3.

Test Example 3

Photoluminescence (PL) Measurement and Comparison of Trion ($A^-$)/Exciton ($A^0$) Intensity In this test example, the optical characteristics of the transition metal chalcogenide thin film prepared according to the present disclosure were measured.

Figure 5:
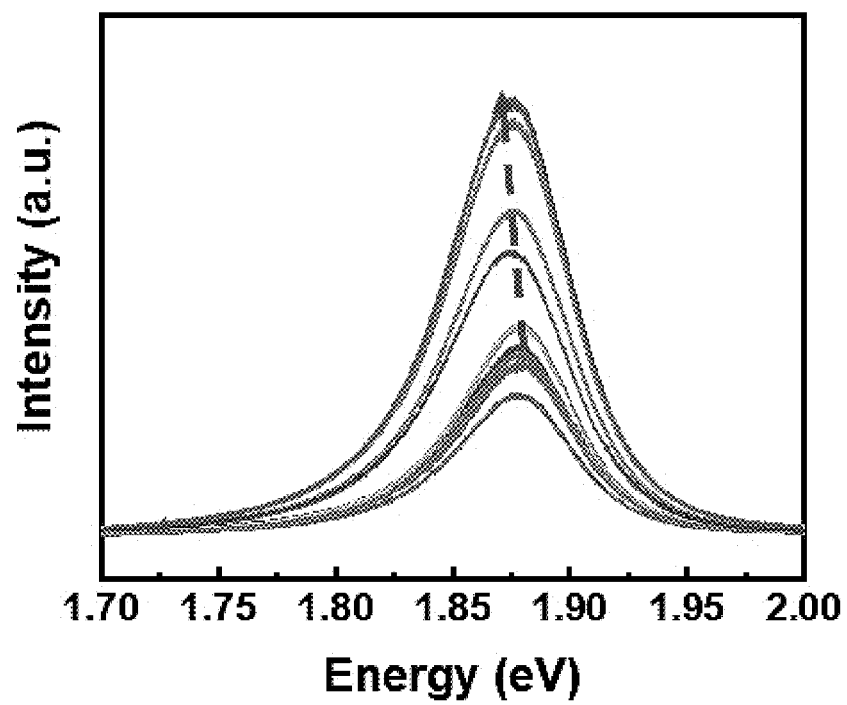
FIGS. 5 and 6 show a photoluminescence (PL) measurement result and a trion ($A^-$)/exciton ($A^0$) intensity measurement result, respectively.
Figure 6:
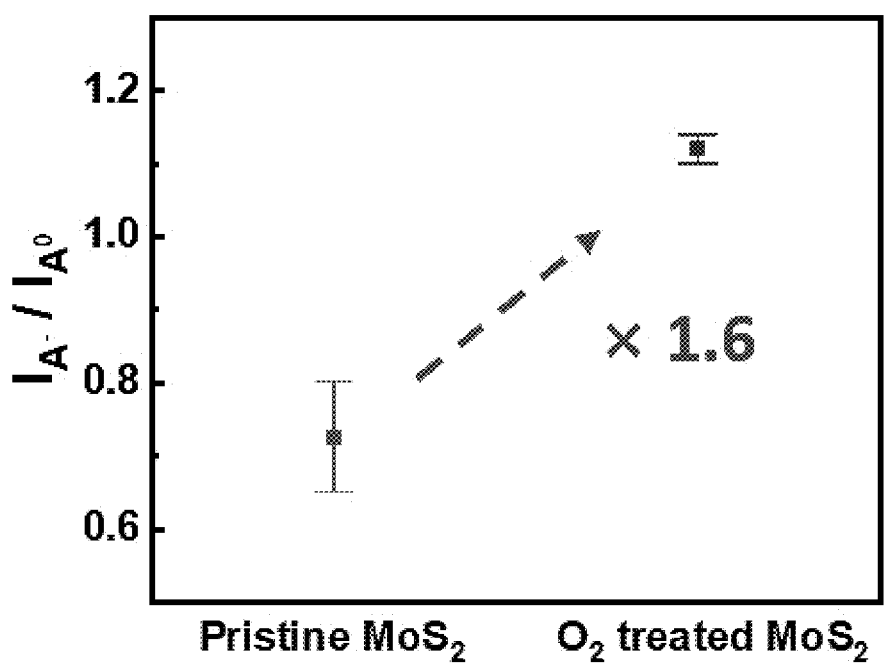

FIGS. 5 and 6 show a photoluminescence (PL) measurement result and a trion ($A^-$)/exciton ($A^0$) intensity measurement result, respectively.

Referring to FIG. 5, it can be seen that the thin film that has undergone the defect control step according to the present disclosure ($O_2$-treated $MoS_2$) shows increased PL intensity as well as red shift (indicated by red arrow).

The increase in PL intensity means that the defect state which causes non-radiative recombination in the band gap has been removed, which is a result of binding of oxygen to the sulfur vacancy existing in the highly reactive grain boundary. In addition, the red shift of the PL peak and the increased intensity of trion as compared to exciton are the typical results obtained when the $MoS_2$ thin film is n-doped. These results are consistent with FIGS. 3 and 4.

As described above, the present disclosure is advantageous in terms of consistency and stability because interatomic defects can be controlled. The existing method of creating vacancies of a chalcogenide component (e.g., S in $MoS_2$) using plasma is problematic in that the thin film may be damaged since physical impact (ion bombardment) is applied thereto. In contrast, the present disclosure can modulate electrical/optical characteristics as desired without physical damage because it is based on interatomic chemical reaction.

In addition, if sulfur vacancy is formed according to the existing method, the vacancy itself forms defects which induces non-radiative recombination in the band gap. That is to say, although n-doping can be induced electrically, optical (specifically PL) characteristics are degraded. However, according to the present disclosure, the degradation of optical characteristics can be prevented because oxygen is bound to the sulfur vacancy.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method for preparing a transition metal chalcogenide comprising:
    a step of forming a transition metal chalcogenide thin film; and
    a step of controlling the defects of the transition metal chalcogenide thin film by injecting a processing gas comprising oxygen to the formed transition metal chalcogenide thin film.

2. The method for preparing a transition metal chalcogenide of claim 1, wherein the step of forming the transition metal chalcogenide thin film comprises:
    a step of forming crystal nuclei of a transition metal chalcogenide on a substrate; and
    a step of growing a transition metal chalcogenide from the crystal nuclei of a transition metal chalcogenide.

3. The method for preparing a transition metal chalcogenide of claim 1, wherein the volume ratio of 02 in the processing gas is 1-10 wt %.

4. The method for preparing a transition metal chalcogenide of claim 3, wherein the processing gas comprises $O_2$ and $N_2$.

5. The method for preparing a transition metal chalcogenide of claim 1, wherein chalcogenide vacancies are formed through the step of controlling the defects and oxygen is bound to the chalcogenide vacancies.

6. The method for preparing a transition metal chalcogenide of claim 5, wherein the transition metal chalcogenide comprises one or more selected from a group consisting of $MoS_2$, $MoSe_2$, $MoTe_2$, $WS_2$, $WSe_2$ and $WTe_2$.

7. The method for preparing a transition metal chalcogenide of claim 6, wherein the transition metal chalcogenide is $MoS_2$ and sulfur vacancies are formed through the step of controlling the defects.

8. A transition metal chalcogenide prepared by the method of claim 1.

9. The transition metal chalcogenide of claim 8, wherein oxygen is located on chalcogenide vacancies of the transition metal chalcogenide.

10. A method for preparing a transition metal chalcogenide comprising:
    forming a transition metal chalcogenide thin film; and
    controlling the defects of the transition metal chalcogenide thin film by injecting an oxygen-containing processing gas.

11. The method for preparing a transition metal chalcogenide of claim 10, wherein the processing gas comprises $O_2$ and $N_2$.

12. The method for preparing a transition metal chalcogenide of claim 11, wherein the volume ratio of 02 in the processing gas is 1-10 wt %.

13. The method for preparing a transition metal chalcogenide of claim 10, wherein n-doping occurs in the transition metal chalcogenide through the control of the defects.

14. The method for preparing a transition metal chalcogenide of claim 10, wherein the transition metal chalcogenide comprises one or more selected from a group consisting of $MoS_2$, $MoSe_2$, $MoTe_2$, $WS_2$, $WSe_2$ and $WTe_2$.

15. The method for preparing a transition metal chalcogenide of claim 2, wherein a temperature of the defect control step is higher than room temperature and lower than a temperature of the growth step.

16. The method for preparing a transition metal chalcogenide of claim 1, wherein n-doping occurs in the transition metal chalcogenide through the control of the defects.

* * * * *